(12) United States Patent
Tung et al.

(10) Patent No.: US 9,414,534 B2
(45) Date of Patent: Aug. 9, 2016

(54) EMI SHIELDING DEVICE AND MANUFACTURING METHOD THEREOF

(71) Applicants: Mean-Jue Tung, Kinmen County (TW); Wen-Song Ko, Hsinchu (TW); Ming-Da Yang, Taichung (TW); Li-Chun Wang, Hsinchu County (TW)

(72) Inventors: Mean-Jue Tung, Kinmen County (TW); Wen-Song Ko, Hsinchu (TW); Ming-Da Yang, Taichung (TW); Li-Chun Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 379 days.

(21) Appl. No.: 13/629,615

(22) Filed: Sep. 28, 2012

(65) Prior Publication Data

US 2013/0322047 A1    Dec. 5, 2013

(30) Foreign Application Priority Data

Jun. 5, 2012   (TW) .............................. 101120158 A

(51) Int. Cl.
*H05K 9/00*       (2006.01)

(52) U.S. Cl.
CPC ............. *H05K 9/0075* (2013.01); *Y10T 156/10* (2015.01)

(58) Field of Classification Search
CPC ...................................................... H05K 13/00
USPC ............................ 361/818; 338/321; 333/24.2
See application file for complete search history.

(56) References Cited

U.S. PATENT DOCUMENTS

| 4,304,987 A | * | 12/1981 | van Konynenburg .. | H01C 7/027 219/505 |
| 4,314,231 A | * | 2/1982 | Walty ..................... | H01C 7/027 338/212 |
| 4,545,926 A | * | 10/1985 | Fouts, Jr. .................. | H01B 1/20 252/502 |
| 4,560,498 A | * | 12/1985 | Horsma ................ | C08L 101/00 252/511 |
| 4,689,475 A | | 8/1987 | Kleiner et al. | |
| 4,786,888 A | * | 11/1988 | Yoneda ..................... | H01C 7/04 219/505 |

(Continued)

FOREIGN PATENT DOCUMENTS

| CN | 1957500 | 5/2007 |
| GB | 2055264 | 2/1981 |

(Continued)

OTHER PUBLICATIONS

Li et al., "Enhanced microwave absorption in nickel/hexagonal-ferrite/polymer composites," Applied Physics Letters 89, Sep. 27, 2006, pp. 132504-1-132504-3.

(Continued)

*Primary Examiner* — Courtney Smith
*Assistant Examiner* — Rashen E Morrison
(74) *Attorney, Agent, or Firm* — Jianq Chyun IP Office

(57) ABSTRACT

An electromagnetic interference (EMI) shielding device and manufacturing method thereof are provided. The EMI shielding device includes at least one ferrite material outer layer, a first and a second electrodes within the ferrite material outer layer, and a positive temperature coefficient resistor (PTCR) core layer sandwiched between the first and the second electrodes in the ferrite material outer layer. The first and the second electrodes extend to two ends of the ferrite material outer layer respectively.

7 Claims, 3 Drawing Sheets

(56) References Cited

U.S. PATENT DOCUMENTS

| | | | | |
|---|---|---|---|---|
| 4,924,204 | A * | 5/1990 | Uchida | H01C 1/1406 338/22 R |
| 5,089,801 | A * | 2/1992 | Chan | H01C 1/1406 219/505 |
| 5,831,324 | A * | 11/1998 | Bang | H01L 21/76224 257/508 |
| 6,223,423 | B1 * | 5/2001 | Hogge | H01C 1/1406 29/610.1 |
| 6,429,533 | B1 * | 8/2002 | Li | H01C 1/1406 257/700 |
| 6,606,231 | B2 * | 8/2003 | Rumer | H04M 3/18 361/104 |
| 6,781,481 | B2 * | 8/2004 | Richardson | H03H 7/427 333/12 |
| 6,854,176 | B2 * | 2/2005 | Hetherton | H01C 1/1406 29/417 |
| 7,075,408 | B2 * | 7/2006 | Mihara | H01C 7/021 338/204 |
| 7,343,671 | B2 * | 3/2008 | Hetherton | H01C 1/1406 156/228 |
| 7,355,504 | B2 * | 4/2008 | Graves | H01C 1/14 338/22 R |
| 7,852,192 | B2 * | 12/2010 | Yu | H01C 1/01 338/22 R |
| 8,590,142 | B2 * | 11/2013 | Tanaka | H01C 1/1406 29/623 |
| 8,686,826 | B2 * | 4/2014 | Chandler et al. | 338/22 R |
| 2007/0063784 | A1 * | 3/2007 | Kawanami | 333/24.2 |
| 2008/0186128 | A1 | 8/2008 | Chang et al. | |
| 2010/0200817 | A1 * | 8/2010 | Chen | H01B 1/24 252/511 |
| 2011/0183162 | A1 | 7/2011 | Chandler et al. | |
| 2013/0322047 | A1 * | 12/2013 | Tung | H05K 9/0075 361/818 |

FOREIGN PATENT DOCUMENTS

| | | |
|---|---|---|
| TW | 334166 | 6/1998 |
| TW | 516047 | 1/2003 |
| TW | 200401001 | 1/2004 |
| TW | I229472 | 3/2005 |
| TW | 200713342 | 4/2007 |
| TW | 200746374 | 12/2007 |
| TW | 200834612 | 8/2008 |
| TW | 200900891 | 1/2009 |
| TW | 201001450 | 1/2010 |
| TW | M420809 | 1/2012 |

OTHER PUBLICATIONS

Lee et al., "Influence of aspect ratio and skin effect on EMI shielding of coating materials fabricated with carbon nanofiber/PVDF," Journal of Materials Science 37, May 1, 2002, pp. 1839-1843.

Chen et al., "Integrated IPMC/PVDF Sensory Actuator and Its Validation in Feedback Control," Sensors and Actuators A, Feb. 13, 2008, pp. 1-18.

Yu et al., "Permittivity, Thermal Conductivity and Thermal Stability of Poly(vinylidene fluoride)/Graphene Nanocomposites," IEEE Transactions on Dielectrics and Electrical Insulation 18 (2), Apr. 2011, pp. 478-484.

"Office Action of Taiwan Counterpart Application", issued on Jul. 22, 2014, p. 1-p. 10.

"Office Action of Chinese Counterpart Application", issued on Nov. 2, 2015, p. 1-p. 6.

* cited by examiner

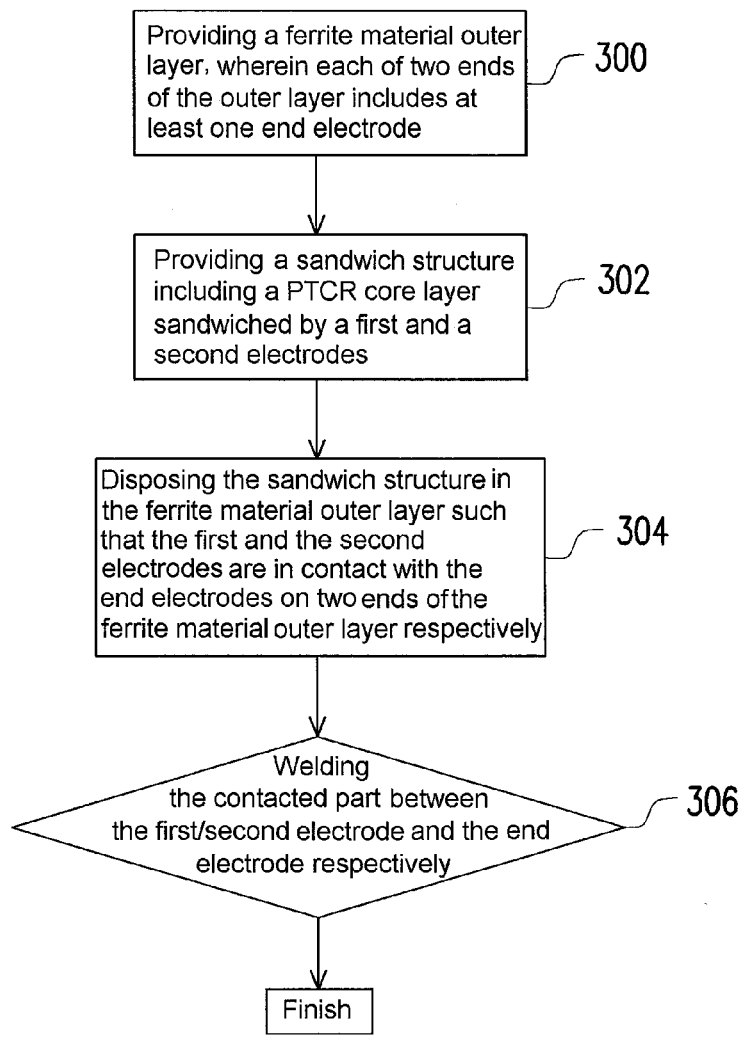

EMI SHIELDING DEVICE AND MANUFACTURING METHOD THEREOF

CROSS-REFERENCE TO RELATED APPLICATION

This application claims the priority benefit of Taiwan application serial no. 101120158, filed on Jun. 5, 2012. The entirety of the above-mentioned patent application is hereby incorporated by reference herein and made a part of this specification.

TECHNICAL FIELD

The disclosure relates to an electromagnetic interference (EMI) device and a manufacturing method thereof.

BACKGROUND

With the trend of electronic communication devices becoming lighter, thinner, shorter, smaller and multifunctional, as well as acceleration of data transmission speed, electronic devices assembled inside electronic products need to be accordingly of high integration, high assembly density and low production cost. If it is necessary to achieve high transmission speed in small devices, the EMI is a problem that needs to be solved.

In the products such as notebook, LCD display, USB and so forth, laminated high-current chip beads are utilized to suppress EMI that is designed to be close to power cords of the products. In case of in-phase current (i.e. common mode current), due to overlapping magnetic fluxes, impedance will be generated for eliminating noise. On the other hand, when reverse current passes (i.e. normal mode), the generated magnetic fluxes cancel each other, and thus no impedance is created. Using the characteristic impedance of ferrite material with frequency to reduce the radiated noise is a cheap and commonly used device for EMI.

SUMMARY

One of exemplary embodiments comprises an EMI shielding device including at least one ferrite material outer layer, a positive temperature coefficient resistor (PTCR) core layer, and a first electrode and a second electrode. The PTCR core layer is sandwiched between the first electrode and the second electrode in the ferrite material outer layer. The first electrode and the second electrode are also disposed in the ferrite material outer layer. The first electrode and the second electrode respectively extend to two ends of the ferrite material outer layer.

Another of exemplary embodiments comprises a method of manufacturing above EMI shielding device. In the method, a ferrite material outer layer is provided, wherein each of two ends of the ferrite material outer layer includes at least one end electrode. A sandwich structure is provided, wherein the sandwich structure includes a first electrode, a second electrode, and a PTCR core layer sandwiched between the first and the second electrodes. The sandwich structure is disposed inside the ferrite material outer layer, such that the first and the second electrodes are respectively in contact with the end electrode on each of the two ends of the ferrite material outer layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2B is a cross-sectional view of the EMI shielding device of FIG. 2A.

FIG. 3 is a flow chart illustrating steps for manufacturing an EMI shielding device according to a third exemplary embodiment.

DETAILED DESCRIPTION OF DISCLOSED EMBODIMENTS

Figure 1:
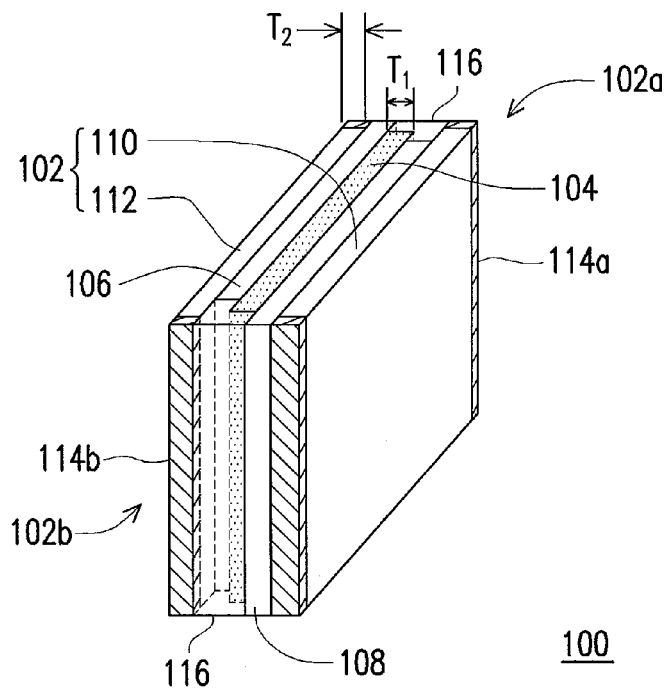
FIG. 1 is a three dimensional schematic view of an EMI shielding device according to a first exemplary embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a three dimensional schematic view of an EMI shielding device with current protection performance according to the first exemplary embodiment.

Referring to FIG. 1, the EMI shielding device 100 of the first exemplary embodiment includes a ferrite material outer layer 102, a positive temperature coefficient resistor (PTCR) core layer 104, and a first and a second electrodes 106 and 108. The PTCR core layer 104 is sandwiched between the first and the second electrodes 106 and 108, and they are disposed in the ferrite material outer layer 102. The first electrode 106 extends to one end 102a of the ferrite material outer layer 102, and the second electrode 108 extends to another end 102b of the ferrite material outer layer 102.

Please continue referring to FIG. 1. The ferrite material outer layer 102 in the figure includes two lamellar outer layers 110 and 112, for sandwiching the first and the second electrodes 106 and 108 and the PTCR core layer 104. A thickness ratio ($T_1:T_2$) of the PTCR core layer 104 to the lamellar outer layer 110 or 112 is, for example, between 1:1 and 1:5. The thicknesses of the two lamellar outer layers 110 and 112 are adjustable to alter the EMI absorption effect. Therefore, the thicknesses of the two lamellar layers 110 and 112 may be the same or different. Since the lamellar outer layers 110 and 112 have high permeability, the EMI and magnetic field shielding effect may be improved. Additionally, two end electrodes 114a and 114b may be disposed on the two ends 102a and 102b of the ferrite material outer layer 102 respectively such that the end electrodes 114a and 114b are in contact with the first and the second electrodes 106 and 108 separately.

In the first exemplary embodiment, a material of the ferrite material outer layer 102 may be metal with permeability; for example, it may be selected form one of Iron (Fe), Cobalt (Co), Nickel (Ni), and a compound thereof. Alternatively, a material of the ferrite material outer layer 102 may be metallic ferrite, and it may be selected from a group consisting of Mn—Zn based ferrite, Ni—Zn based ferrite, Cu—Zn based ferrite, Ni—Cu—Zn based ferrite, Mg—Zn based ferrite, Li—Zn based ferrite and a mixture thereof. A material of the PTCR core layer 104 is usually a conducting polymer material. The first and the second electrodes 106 and 108 may be Copper electrodes or other appropriate metal electrodes. Moreover, in the first exemplary embodiment, a sealant material 116 (for example silicone) is further used to seal the two ends 102a and 102b of the ferrite material outer layer 102.

Figure 2A:
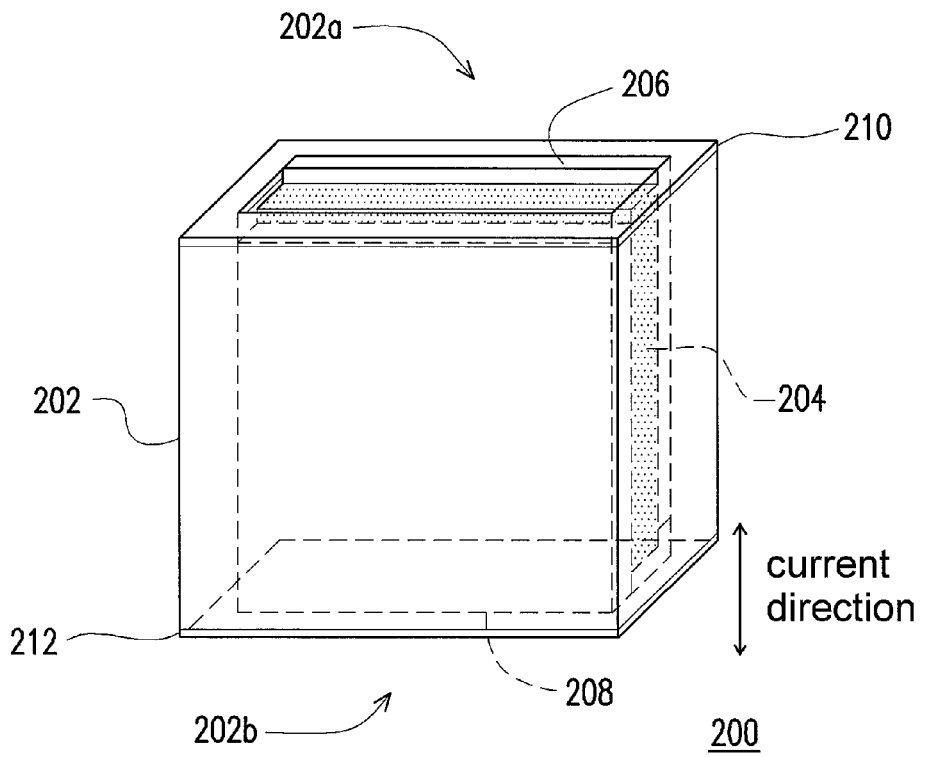
FIG. 2A is a three dimensional schematic view of an EMI shielding device according to a second exemplary embodiment.

FIG. 2A is a three dimensional schematic view of an EMI shielding device with current protection performance according to the second exemplary embodiment.

Referring to FIG. 2A, the EMI shielding device of the second exemplary embodiment 200 includes a ferrite material outer layer 202, a PTCR core layer 204, and a first and a second electrodes 206 and 208. The PTCR core layer 204 is sandwiched by the first and the second electrodes 206 and 208, wherein the first electrode 206 extends to one end 202a of the ferrite material outer layer 202, and the second electrode 208 extends to another end 202b of the ferrite material outer layer 202. The ferrite material outer layer 202 in FIG. 2 is a hollow pillar structure, and the PTCR core layer 204 is disposed in the hollow pillar structure (i.e. 202). In a cross section perpendicular to a current direction (as show in FIG. 2B), a cross-sectional area ration of the hollow pillar structure (i.e. 202) to the PTCR core layer 204 is, for example, larger than 1:1 and smaller than 10:1. Additionally, two end electrodes 210 and 212 may be disposed on the two ends 202a and 202b of the ferrite material outer layer 202 in order to contact with the first and the second electrodes 206 and 208 respectively. As to materials of the ferrite material outer layer 202 and the PTCR core layer 204, please refer to previous exemplary embodiment.

Above two exemplary embodiments is utilized to expand on the disclosure so a person having ordinary skill in the art may understand the concept of the disclosure, but the disclosure is not limited thereto. The EMI shielding device with current protection performance may be suitable for USB transmission circuits, charge-discharge circuit boards, cell phone circuit boards, circuit boards of equipment instruments, or current protection equipments.

FIG. 3 is a flow chart illustrating steps for manufacturing an EMI shielding device with current protection performance according to the third exemplary embodiment.

Referring to FIG. 3, in the step 300, a ferrite material outer layer is first provided, wherein each of two ends of the outer layer includes at least one end electrode. The method of providing the ferrite material outer layer includes a sintering process or a molding process. For example, the sintering process includes producing a blank containing a ferrite material, and then sintering the blank under high temperatures of approximately 900° C. to 1100° C. The blank is, for example, made by producing powders through mixing, calcination, ball milling, sintering, and pulverization, and then undergoes granulation to be molded by appropriate molds into lamellar and hollow pillar structures. Additionally, the molding process, for example, includes producing a mixture containing a ferrite material and a plastic (e.g. silicone or polyphenylene sulfide), and molding the mixture by ejection molding, extrusion molding, or other molding methods.

The ferrite material in the third exemplary embodiment may be the same as the material of the ferrite material outer layer of the first exemplary embodiment. For example, it is selected form one of Fe, Co, Ni, and a compound thereof; alternatively, it is selected from one of metallic ferrite such as Mn—Zn based ferrite, Ni—Zn based ferrite, Cu—Zn based ferrite, Ni—Cu—Zn based ferrite, Mg—Zn based ferrite, Li—Zn based ferrite and a mixture thereof. For example, the ferrite material in the third exemplary embodiment has soft magnetic property and high permeability such as NiCuZn ferrite and so on. The ferrite material outer layer of FIG. 1 or FIG. 2A may be produced by the step 300. An end electrode is then formed on each of the two ends of the ferrite material outer layer, and the method thereof includes, for example, applying a silver paste on the two ends of the ferrite material outer layer and then sintering under a high temperature of approximately 650° C. Since the silver paste is not completely sealed on the ferrite material outer layer, if the ferrite material outer layer is a hollow pillar structure, the end electrodes adhere to the two ends of the hollow pillar structure after sintering.

In the step 302, a sandwich structure is provided, and this structure includes a first electrode, a second electrode, and a PTCR core layer sandwiched by the first and the second electrodes. Referring to FIG. 1 or FIG. 2A for this sandwich structure, wherein the first electrode and the second electrode may slightly protrude from the two ends of the PTCR core layer respectively.

Subsequently, in the step 304, the sandwich structure is disposed in the ferrite material outer layer, such that the first electrode is in contact with the end electrode on one end of the ferrite material outer layer, and that the second electrode is in contact with the end electrode on another end of the ferrite material outer layer.

After the step 304, it is optionally to perform the step 306 of welding respectively the contacted part between the first/second electrode and the end electrode. Then, the two ends of the ferrite material outer layer may be sealed with a sealant material (such as silicone) further.

The following experimental results are shown to verify the effects of the above-mentioned exemplary embodiments.

Experiment 1

First, three composites with different proportion of constituent materials are prepared as follows.

Composite A: 65.2% by weight of iron oxide, 8.2% by weight of nickel oxide, 19.9% by weight of zinc oxide, and 6.7% by weight of copper oxide.

Composite B: 66.1% by weight of iron oxide, 7.3% by weight of nickel oxide, 22.6% by weight of zinc oxide, and 4.0% by weight of copper oxide.

Composite C: 66.0% by weight of iron oxide, 4.6% by weight of nickel oxide, 22.7% by weight of zinc oxide, and 6.7% by weight of copper oxide.

The above-mentioned composites A-C are wet mixed, sintered at 850° C., ball milled and then baked. The baked material (CuZn ferrite powder) is mixed with a water solution containing 4% PVA resin for granulation, and press molded by appropriate molds to form lamellar blanks. The lamellar blanks are debound and sintered under a high temperature of 1000° C. to form sintered NiCuZn ferrite sheets with a thicknesses of 0.5 mm. Next, the two ends of the sintered ferrite sheets are coated with a silver paste. A sintering process is then performed at 650° C., such that a ferrite sheet with end electrodes is produced.

Next, a sandwich structure composed of electrode layer/PTCR conducting polymer material/electrode layer is inserted between the two ferrite sheets with end electrodes. Thereafter, the electrode layers are respectively welded to each of the end electrodes, and the sides of the outer layer are then coated with an insulating paste (i.e. sealant material 116) to prevent the two electrode layers from short. The resulting structure is the same as the EMI shielding device with current protection performance shown in FIG. 1. In the Experiment 1, the thickness of the PTCR core layer is 1-5 mm.

Figure 4:
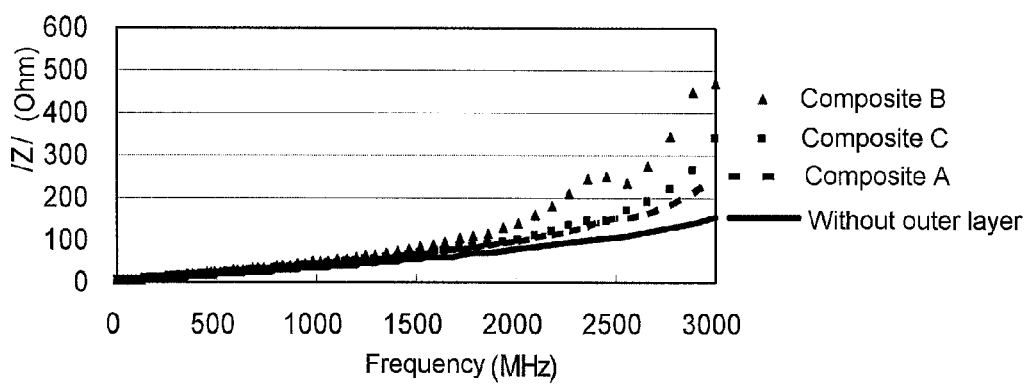
FIG. 4 is a graph showing impedance /Z/ versus frequency according to the devices of Experiment 1.

In addition, a device without outer layer is produced. The above devices are tested by Agilent E4991A RF impedance/material analyzer, and a graph showing impedance /Z/ versus frequency of the devices is demonstrated in FIG. 4. In FIG. 4, the devices produced from composites A-C have high impedance at high frequencies.

Experiment 2

The same composites A-C of experiment 1 are wet mixed, sintered at 850° C., ball milled and then baked. The baked material is mixed with a water solution containing 4% PVA resin for granulation, and press molded by appropriate molds to form hollow pillars. The hollow pillars are debound and sintered under a high temperature of 1000° C. to form sintered NiCuZn ferrite hollow pillar structures. Next, the two ends of the sintered ferrite hollow pillar structure are coated with a silver paste. A sintering process is then performed at 650° C., such that a hollow pillar ferrite structure with end electrodes.

A sandwich structure composed of electrode layer/PTCR conducting polymer material/electrode layer is inserted in the hollow pillar ferrite structure with end electrodes. Then, the electrode layers are respectively welded to each of the end electrodes. The resulting structure is the same as the EMI shielding device with current protection performance shown in FIG. 2A. In Experiment 2, the cross-sectional area ratio of the hollow pillar structure to the PTCR core layer is larger than 1:1 and smaller than 10:1.

Figure 5:
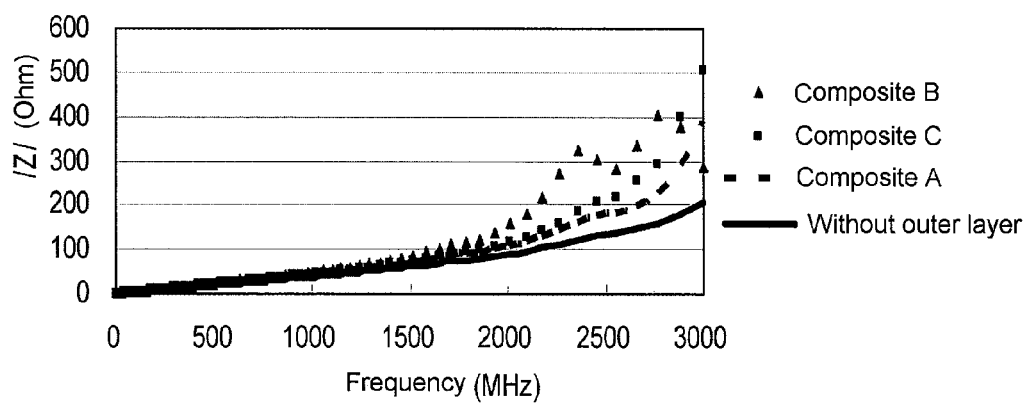
FIG. 5 is a graph showing impedance /Z/ versus frequency according to the devices of Experiment 2.

Moreover, a device without outer layer is produced. The above devices are tested by Agilent E4991A RF impedance/material analyzer, and a graph showing impedance /Z/ versus frequency of the devices is demonstrated in FIG. 5. In FIG. 5, the devices produced from composites A-C have high impedance at high frequencies.

Based on the above, the device of the disclosure is formed by molding soft magnetic ferrite material into high-current resistant chip beads, and installing the PTCR material therein to form a multifunctional device, which has the performance to protect against currents and shield EMI. Therefore during normal operation, the ferrite material outer layer is effective in eliminating high frequency noise. The PTCR core layer and the electrodes are current channels, and they function as self recovery fuse when overcurrent. Accordingly, the device may provide high frequency noise filtering and protection against currents, achieving what a traditional single device cannot.

In sum, according to the disclosure, a high impedance magnetic material is utilized as an EMI shield, and a high permeability material with property of inductive reactance is utilized to adjust current resisting characteristic of the conducting PTCR material, thereby achieving the protection range of operating currents. Therefore, the device of the disclosure may concurrently serve the functions of shielding EMI and acting as a self-recovery current protection component. Moreover, the property of inductance may result in the effect of EMI filter, and therefore it may be used in a high impedance EMI filter device with current protection performance. Additionally, the structure of the disclosure does not integrate the functions of different functional structures, but integrates functions of different devices to obtain a low-cost thin type product.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electromagnetic interference shielding device, comprising:
    two lamellar ferrite material outer layers, being the outer most layer of the electromagnetic interference shielding device, wherein the two lamellar ferrite material outer layers are laterally configured and have high permeability;
    a first electrode and a second electrode, disposed in between the two lamellar ferrite material outer layers, and the first electrode and the second electrode respectively extend to two ends of the two lamellar ferrite material outer layers; and
    a positive temperature coefficient resistor (PTCR) core layer, sandwiched between the first electrode and the second electrode in the two lamellar ferrite material outer layers.

2. The electromagnetic interference shielding device as claimed in claim 1, further comprising a plurality of end electrodes, disposed on the two ends of the two lamellar ferrite material outer layers respectively.

3. The electromagnetic interference shielding device as claimed in claim 1, wherein a thickness ratio of the PTCR core layer to each of the two lamellar ferrite material outer layers is between 1:1 and 1:5.

4. The electromagnetic interference shielding device as claimed in claim 1, wherein a material of the two lamellar ferrite material outer layers is selected form one of Iron, Cobalt, Nickel, and a compound thereof.

5. The electromagnetic interference shielding device as claimed in claim 1, wherein a material of the two lamellar ferrite material outer layers is selected from a group consisting of Mn—Zn based ferrite, Ni—Zn based ferrite, Cu—Zn based ferrite, Ni—Cu—Zn based ferrite, Mg—Zn based ferrite, Li—Zn based ferrite and a mixture thereof.

6. The electromagnetic interference shielding device as claimed in claim 1, wherein a material of the PTCR core layer is a conducting polymer material.

7. The electromagnetic interference shielding device as claimed in claim 1, suitable for USB transmission circuits, charge-discharge circuit boards, cell phone circuit boards, circuit boards of equipment instruments, or current protection equipments.

* * * * *